(12) United States Patent
Ahn et al.

(10) Patent No.: US 7,485,894 B2
(45) Date of Patent: Feb. 3, 2009

(54) THIN FILM TRANSISTOR AND FLAT PANEL DISPLAY INCLUDING THE SAME

(75) Inventors: Taek Ahn, Suwon-si (KR); Min-Chul Suh, Suwon-si (KR); Jin-Seong Park, Suwon-si (KR); Seok-Jong Lee, Suwon-si (KR); Jung-Han Shin, Suwon-si (KR)

(73) Assignee: Samsung Mobile Display Co., Ltd., Suwon-si (KR)

( * ) Notice: Subject to any disclaimer, the term of this patent is extended or adjusted under 35 U.S.C. 154(b) by 55 days.

(21) Appl. No.: 11/582,534

(22) Filed: Oct. 18, 2006

(65) Prior Publication Data

US 2007/0090352 A1  Apr. 26, 2007

(30) Foreign Application Priority Data

Oct. 20, 2005  (KR)  .................. 10-2005-0099353

(51) Int. Cl.
*H01L 29/08* (2006.01)
(52) U.S. Cl. .............................. 257/40; 257/59; 257/72; 257/E51.006
(58) Field of Classification Search .................. 257/40, 257/59, 72, 347, E51.005, E51.006, E51.049, 257/E51.05
See application file for complete search history.

(56) References Cited

U.S. PATENT DOCUMENTS

2005/0057136 A1*  3/2005  Moriya et al. ............... 313/311

FOREIGN PATENT DOCUMENTS

| JP | 2004-103905 | * | 4/2004 |
|---|---|---|---|
| KR | 2004-12212 | | 2/2004 |
| KR | 2004-57510 | | 7/2004 |
| KR | 2005-80503 | | 8/2005 |
| KR | 2005-4565 | | 12/2005 |

OTHER PUBLICATIONS

U.S. Appl. No. 11/594,903, filed Nov. 2006, Lee et al.
U.S. Appl. No. 11/582,467, filed Oct. 18, 2006, Park et al.

* cited by examiner

*Primary Examiner*—Minh-Loan T Tran
(74) *Attorney, Agent, or Firm*—Stein, McEwen & Bui, LLP (57) ABSTRACT

A thin film transistor includes: a gate electrode; source and drain electrodes insulated from the gate electrode; an organic semiconductor layer that is insulated from the gate electrode and is electrically connected to the source and drain electrodes; an insulating layer that insulates the gate electrode from the source and drain electrodes or the organic semiconductor layer; and an ohmic contact layer that is interposed between the source/drain electrodes and the organic semiconductor and contains a compound having a hole transporting unit. By providing the ohmic contact layer, the ohmic contact between source/drain electrodes and the organic semiconductor layer can be effectively achieved and the adhesive force between the source/drain electrodes and the organic semiconductor layer is increased. In addition, a flat panel display having improved reliability can be obtained using the thin film transistor.

12 Claims, 2 Drawing Sheets

THIN FILM TRANSISTOR AND FLAT PANEL DISPLAY INCLUDING THE SAME

CROSS-REFERENCE TO RELATED APPLICATIONS

This application claims the benefit of Korean Patent Application No. 2005-99353, filed on Oct. 20, 2005, in the Korean Intellectual Property Office, the disclosure of which is incorporated herein in its entirety by reference.

BACKGROUND OF THE INVENTION

1. Field of the Invention

Aspects of the present invention relate to a thin film transistor (TFT) and a flat panel display including the same, and more particularly, to a TFT in which an ohmic contact between an organic semiconductor layer and source/drain electrodes is achieved and an adhesive force between the organic semiconductor and the source/drain electrodes is increased, and a flat panel display including the TFT.

2. Description of the Related Art

Thin film transistors (TFTs) are used as switching devices for controlling pixel operations and as driving devices for operating pixels in flat panel displays such as liquid crystalline display devices (LCD), organic light-emitting display devices, inorganic light-emitting display devices, and the like.

TFTs include a semiconductor layer including source/drain regions and a channel region interposed between the source region and drain region, a gate electrode insulated from the semiconductor layer and located in a region corresponding to the channel region, and source and drain electrodes respectively contacting the source and drain regions.

Organic TFTs include an organic semiconductor layer composed of an organic semiconductor material. Organic TFTs can be manufactured at low temperatures, and thus, plastic substrates can be used. Due to this advantage of organic TFTs, much research into organic TFTs has been performed recently. For example, Korean Patent Publication No. 2004-0012212 discloses an organic TFT.

However, it is difficult to achieve an ohmic contact between source/drain electrodes and the organic semiconductor layer of an organic TFT because of a difference in the work function between the materials of the source/drain electrodes and the organic semiconductor layer. In addition, since the source and drain electrodes are formed of an inorganic material and the organic semiconductor layer is formed of an organic material, the adhesive force between the source/drain electrodes and the organic semiconductor layer is not strong. Therefore, improvements in these areas are desirable.

SUMMARY OF THE INVENTION

Aspects of the present invention provide a thin film transistor (TFT) in which an ohmic contact between an organic semiconductor layer and source/drain electrodes is achieved, and the adhesive force between the source/drain electrodes and the organic semiconductor layer is increased, and provide a flat panel display including the TFT.

According to an aspect of the present invention, there is provided a thin film transistor comprising: a gate electrode; source and drain electrodes insulated from the gate electrode; an organic semiconductor layer that is insulated from the gate electrode and is electrically connected to the source and drain electrodes; an insulating layer that insulates the gate electrode from the source and drain electrodes or the organic semiconductor layer; and an ohmic contact layer that is interposed between the source and drain electrodes and the organic semiconductor, and that comprises a material that has a work function that is greater than a work function of a material of the source and drain electrodes and less than a work function of a material of the organic semiconductor layer.

According to another aspect of the present invention, there is provided a thin film transistor including: a gate electrode; source and drain electrodes insulated from the gate electrode; an organic semiconductor layer that is insulated from the gate electrode and electrically connected to the source and drain electrodes; an insulating layer that insulates the gate electrode from the source and drain electrodes or the organic semiconductor layer; and an ohmic contact layer interposed between the source/drain electrodes and the organic semiconductor, and that contains a hole transporting compound and/or a compound having a hole transporting unit.

According to another aspect of the present invention, there is provided a method of forming a thin film transistor comprising: forming a gate electrode; forming an insulating layer; forming source and drain electrodes in predetermined regions corresponding to opposite ends of the gate electrode; forming an organic semiconductor layer; and forming an ohmic contact layer between the source and drain electrodes and the organic semiconductor layer, wherein the ohmic layer comprises a hole transporting compound and/or a compound including a hole transporting unit.

According to another aspect of the present invention, there is provided a method of forming a thin film transistor comprising: forming a gate electrode; forming an insulating layer; forming source and drain electrodes in predetermined regions corresponding to opposite ends of the gate electrode; forming an organic semiconductor layer; and forming an ohmic contact layer between the source and drain electrodes and the organic semiconductor layer, wherein the ohmic layer comprises a material that has a work function that is greater than a work function of a material of the source and drain electrodes and less than a work function of a material of the organic semiconductor layer.

According to another aspect of the present invention, there is provided a flat panel display including the thin film transistor in respective pixels, wherein the source or drain electrodes of the thin film transistor is connected to a pixel electrode.

In a TFT according to the present invention, in addition that the ohmic contact between source/drain electrodes and the organic semiconductor layer can be effectively achieved, the adhesive force between the source/drain electrodes and the organic semiconductor layer is increased. In addition, a flat panel display having improved reliability can be obtained using the TFT.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 1:
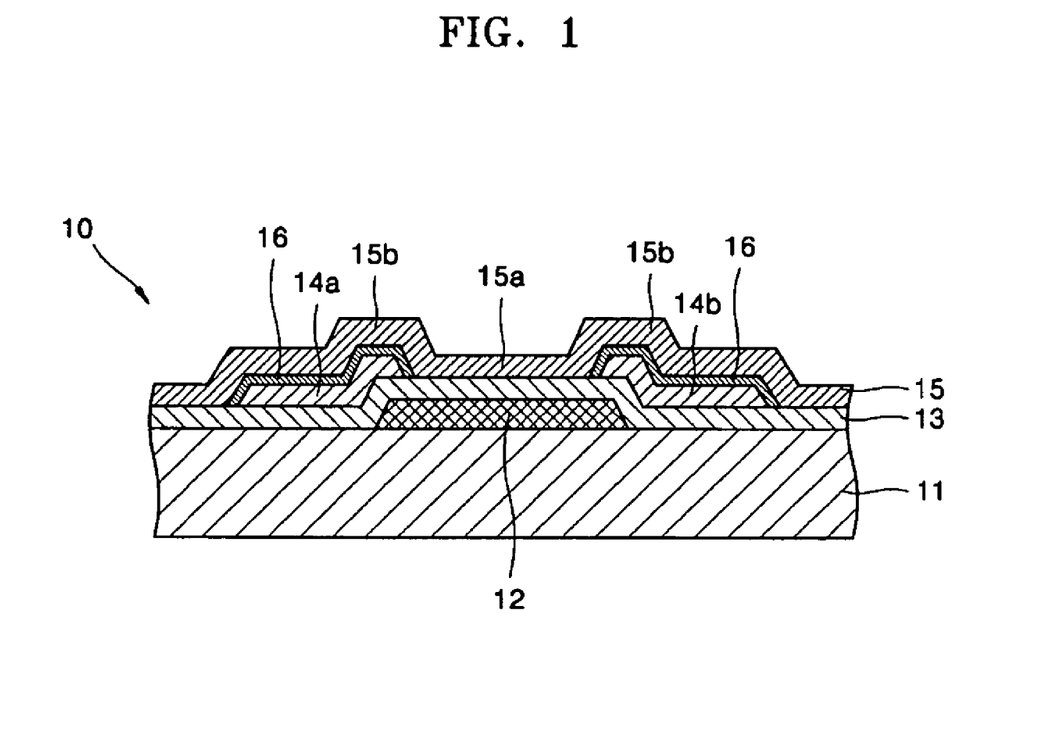
FIGS. 1 through 3 are sectional views illustrating structures of thin film transistors (TFTs) according to embodiments of the present invention.

FIG. 1 is a sectional view of a thin film transistor (TFT) 10 according to an embodiment of the present invention. The TFT 10 includes a substrate 11, a gate electrode 12, an insulating layer 13, source and drain electrodes 14a and 14b, an ohmic contact layer 16, and an organic semiconductor layer 15, which are sequentially stacked upon one another.

The substrate 11 may be a glass, plastic, or metal substrate, but is not limited thereto. The glass substrate may be formed of silicon oxide, silicon nitride, and the like. The plastic substrate may be formed of an insulating organic compound. For example, the insulating organic compound may be selected from the group consisting of polyethersulfone (PES), polyacrylate (PAR), polyetherimide (PEI), polyethylene naphthalate (PEN), polyethyleneterephthalate (PET), polyphenylene sulfide (PPS), polyallylate, polyimide, polycarbonate (PC), cellulous triacetate (CAT), and cellulose acetate propionate (CAP), but is not limited thereto. The metal substrate may include at least one selected from the group consisting of carbon, iron, chrome, manganese, nickel, titanium, molybdenum, stainless steel (SUS), an Invar alloy, a Zinconel alloy, and a Kovar alloy, but is not limited thereto. The metal substrate may be a metal foil. If flexibility is desired, a plastic or metal substrate can be used for the substrate 11.

A buffer layer, a barrier layer, or an impurities diffusion inhibition layer may be formed on one surface or both surfaces of the substrate 11. In particular, when the substrate 11 is a metal substrate, an insulating layer (not shown) may be further formed on the substrate 11.

According to the embodiment of FIG. 1, the gate electrode 12 having a predetermined pattern is formed on the substrate 11. For example, the gate electrode 12 may be formed of a metal or a metal alloy, such as Au, Ag, Cu, Ni, Pt, Pd, Al, Mo, an Al:Nd alloy, an Mo:W alloy, etc. but the material of the gate electrode 12 is not limited thereto.

According to the embodiment of FIG. 1, the insulating layer 13 is formed on the gate electrode 12 to cover the gate electrode 12. The insulating layer 13 may be formed of an inorganic compound, such as a metal oxide or a metal nitride, or an organic compound, such as an insulting organic polymer, but the material of the insulating layer 13 is not limited to thereto.

According to the embodiment of FIG. 1, the source and drain electrodes 14a and 14b are formed on the insulating layer 13. As shown in FIG. 1, the source and drain electrodes 14a and 14b may overlap with a part of the gate electrode 12, but the structure of the source and drain electrodes 14a and 14b is not limited thereto. Non-limiting examples of the material for the source and drain electrodes 14a and 14b include metals, such as Au, Pd, Pt, Ni, Rh, Ru, Ir, Os, Al and Mo, metal alloys of at least two metals, an Al:Nd alloy, an MoW alloy, metallic oxides, such as indium tin oxide (ITO), indium zinc oxide (IZO), NiO, $Ag_2O$, $In_2O_3$—$Ag_2O$, $CuAlO_2$, $SrCu_2O_2$, and Zr-doped ZnO. Combinations of two or more of the above-mentioned metals or metallic oxides can be used.

In particular, when the ohmic contact layer 16 is formed on the source and drain electrodes 14a and 14b using a self-assembled monolayer manufacturing process, the source and drain electrodes 14a and 14b may be formed of an oxidizable metal or a metallic oxide.

According to the embodiment of FIG. 1, the organic semiconductor layer 15 is formed on the source and drain electrodes 14a and 14b. Examples of an organic semiconductor material for the organic semiconductor layer 15 include pentacene, tetracene, anthracene, naphthalene, α-6-thiophen, α-4-thiophen, perylene and a derivative thereof, rubrene and a derivative thereof, coronene and a derivative thereof, perylene tetracarboxylic diimide and a derivative thereof, perylene tetracarboxylic dianhydride and a derivative thereof, polythiophene and a derivative thereof, polyparaphenylene vinylene and a derivative thereof, polyparaphenylene and a derivative thereof, polyfluorene and a derivative thereof, polythiophene vinylene and a derivative thereof, a polythiophene-heterocyclic aromatic copolymer and a derivative thereof, an oligonaphthalene and a derivative thereof, an oligothiophene of α-5-thiophene and a derivative thereof, a metal-containing or metal-free phthalocyanine and a derivative thereof, pyromellitic dianhydride and a derivative thereof, pyromellitic diimide and a derivative thereof, or the like. Combinations of two or more of these materials can be used.

According to the embodiment of FIG. 1, the ohmic contact layer 16 forms an ohmic contact between the source/drain electrodes 14a and 14b and the organic semiconductor layer 15. Therefore, a material for the ohmic contact layer 16 may have a work function that is in between the work function of the material of the source/drain electrodes 14a and 14b and the work function of the material of the organic semiconductor layer 15. For example, when the source and drain electrodes 14a and 14b are formed of ITO having a work function of about 4.8-5.0 eV, and the organic semiconductor layer 15 is formed of pentacene having a work function of about 5.2-5.4 eV, there is a difference in work function of about 0.6 eV and thus, an ohmic contact is not effectively achieved. Therefore, by forming the ohmic contact layer 16 using a material that has a work function between the work function of the source and drain electrodes 14a and 14b and the work function of the organic semiconductor layer 15, the contact barrier between the source and drain electrodes 14a and 14b and the organic semiconductor layer 15 can be reduced. Thus, an ohmic contact can be realized. In addition, because the ohmic contact layer 16 is located in the interface between the source/drain electrodes 14a and 14b and the organic semiconductor layer 15, the ohmic contact layer 16 increases the adhesive force between the source/drain electrodes 14a and 14b and the organic semiconductor layer 15.

Considering the work functions of materials which form the source/drain electrodes 14a and 14b and the organic semiconductor layer 15, a compound having a hole transporting unit that is included in the ohmic contact layer 16 may have a work function of 4.5-5.5 eV. In this case, a contact barrier reduction effect can be achieved due to the ohmic contact layer 16.

The ohmic contact layer 16 may include a hole transporting compound. Non-limiting examples of the hole transporting compound include and the like.

In the above formula of hole transporting compounds, $R_1$, $R_2$, $R_3$, $R_4$, $R_5$, $R_6$ and $R_7$ may independently be hydrogen or a substituted or unsubstituted $C_6$-$C_{30}$ aryl group, (such as, for example, a substituted or unsubstituted $C_6$-$C_{20}$ aryl group) or a substituted or unsubstituted $C_5$-$C_{30}$ heteroaryl group (such as, for example, a substituted or unsubstituted $C_5$-$C_{20}$ heteroaryl group). At least one of $R_1$, $R_2$ and $R_3$, and at least one of $R_4$, $R_5$, $R_6$ and $R_7$ should be a substituted or unsubstituted $C_6$-$C_{30}$ aryl group, or a substituted or unsubstituted $C_5$-$C_{30}$ hetero-aryl group. $R_8$ may be hydrogen or a substituted or unsubstituted $C_1$-$C_{30}$ alkyl group, such as, for example, a $C_1$-$C_{20}$ alkyl group.

In the above formula of hole transporting compounds, $Ar_1$ may be a substituted or unsubstituted $C_6$-$C_{30}$ arylene group (such as, for example, a substituted or unsubstituted $C_6$-$C_{20}$ arylene group) or a substituted or unsubstituted $C_5$-$C_{30}$ heteroarylene group (such as, for example, a substituted or unsubstituted $C_5$-$C_{20}$ heteroarylene group).

In the above formula of hole transporting compounds, n may be an integer from 1 to 10, such as, for example, an integer from 1 to 5.

In the above formula of hole transporting compounds, $Q_1$, $Q_2$, $Q_3$, $Q_4$ and $Q_5$ may be independently selected from N, C, P and S.

Non-limiting examples of the hole transporting compound include N,N'-bis(3-methyphenyl)-N,N'-diphenyl-[1,1-biphenyl]-4,4'-diamine(TPD)-N,N'-di(naphthalene-1-yl)-N,N'-diphenyl benzidine (NPD: including α-NPD and β-NPD), 1,3,5-tricarbazolyl benzene, 4,4'-biscarbazolylbiphenyl (CBP), polyvinylcarbazole, m-biscarbazolylphenyl, 4,4'-bis-carbazolyl-2,2'-dimethylbiphenyl, 4,'4"-tri(N-carbazolyl) triphenylamine, 1,3,5-tri(2-carbazolylphenyl)benzene, 1,3, 5-tris(2-carbazolyl-5-methoxyphenyl)benzene, bis(4-carbazolylphenyl)silane, BMA-Nt, TBA, o-TTA, p-TTA, m-TTA, Spiro-TPD, TPTE, and the like, but are not limited thereto. The terms TPD, α-NPD, β-NPD, CBP BMA-Nt, TBA, o-TTA, p-TTA, m-TTA, Spiro-TPD, and TPTE refer to the following compounds:

α-NPD

β-NPD

TPD

CBP

-continued

BMA-nT

TBA o-TTA p-TTA m-TTA

Spiro-TPD

-continued

TPTE

When the ohmic contact layer 16 is formed of a hole transporting compound as described above, various known deposition methods or coating methods can be used.

Alternatively or additionally, the ohmic contact layer 16 may include a material that includes a hole transporting unit. Such a material may be, for example, a self-assembled monolayer (SAM) formed of a repeating unit that includes the hole transporting unit. The hole transporting unit can be the bound radical of any of the hole transporting compounds described above. That is, the hole transporting unit can be any of the hole transporting compounds described above, except existing as a bound moiety instead of as a free compound. In this context, the term "radical" simply refers to a group or moiety that is bound to a larger compound or structure.

As a particular, non-limiting example, the ohmic contact layer 16 according to an aspect of the present invention may be a self-assembled monolayer(SAM) including a repeating unit of formula (1) below and/or a moiety of formula (2) below:

words, the hole transporting unit can be any of the hole transporting compounds described above, except existing as a bound moiety instead of as a free compound.

In formula (2), $Y_2$, $W_1$ and $W_2$ are each independently selected from hydrogen, a halogen atom, a $C_1$-$C_{20}$ alkyl group, a $C_1$-$C_{20}$ alkoxy group, or a hole transporting unit. However, at least one of $Y_2$, $W_1$ and $W_2$ should be a hole transporting unit. The hole transporting unit is described above.

In formulas (1) and (2), * and *' indicate binding with a surface of the TFT, in particular the surface of the source and drain electrodes 14a and 14b, as in the embodiment of FIG. 1 or the surface of the organic semiconductor layer 15, as in the embodiment of FIG. 2, described below.

The SAM may include an unit of formula (3) and/or (4) below:

In formulas (1) and (2), $X_1$ and $X_2$ may each be a single bond, a substituted or unsubstituted $C_1$-$C_{20}$ alkylene group, such as, for example, a $C_1$-$C_{15}$ alkylene group, or -$Z_1$-NH—C(=O)—O-$Z_2$-. $Z_1$ and $Z_2$ may each be a substituted or unsubstituted $C_1$-$C_{20}$ alkylene group, such as, for example, a $C_1$-$C_{15}$ alkylene group.

In formula (1), $Y_1$ is a hole transporting unit. For example, the hole transporting unit can be the bound radical of any of the hole transporting compounds described above. In other formula (4)

In formulas (3) and (4), * and *' indicate binding with a surface of the source and drain electrodes 14a and 14b or the surface of the organic semiconductor layer 15, as in the embodiment of FIG. 2 (discussed below).

When the ohmic contact layer 16 according to an embodiment of the present invention is an SAM as described above, the ohmic contact layer 16 may be formed using a self-assembled monolayer manufacturing process. The self-assembled monolayer manufacturing process may be carried out by way of various reactions, such as a hydrolysis reaction, a condensation reaction, and the like.

Throughout this specification, where an aryl group, a heteroaryl group, an arylene group or a heteroarylene group is mentioned, such as, for example, in the definition of $R_1$, $R_2$, $R_3$, $R_4$, $R_5$, $R_6$ and $R_7$ or $Ar_1$ in the examples of the hole transporting compound or hole transporting unit, such a group may include at least two or more carbocyclic rings, which may be attached together or may be fused.

The aryl group, heteroaryl group, arylene group or heteroarylene group may be each substituted by a halogen atom, a cyano group, a hydroxyl group, a $C_1$-$C_{20}$ alkyl group, a $C_6$-$C_{30}$ aryl group, or a $C_5$-$C_{30}$ heteroaryl group. In addition, the $C_1$-$C_{20}$ alkyl group may be substituted by a halogen atom, a cyano group, a hydroxyl group, a $C_1$-$C_{20}$ alkyl group, a $C_6$-$C_{30}$ aryl group, or a $C_5$-$C_{30}$ heteroaryl group.

The heteroaryl group or heteroarylene group may include at least one a hetero atom selected from the group consisting of N, P and S.

The ohmic contact between the source/drain electrodes 14a and 14b and the organic semiconductor layer 15 can be realized, and the adhesive force therebetween can be increased by the ohmic contact layer 16. As a result, electrical properties, lifespan, etc., of the TFT 10 can be improved.

Although the ohmic contact layer 16 is shown in FIG. 1 as being formed on the source and drain electrodes 14a and 14b, the structure of the ohmic contact layer 16 can be varied. For example, the ohmic contact layer 16 may extend to below a channel region 15a of the organic semiconductor layer 15. In particular, when the ohmic contact layer 16 extends to below the channel region 15a of the organic semiconductor layer 15, charge trapping, etc., of the insulating layer 13 can be inhibited, and the crystalline property of the organic semiconductor layer 15 and the adhesive force between the ohmic contact layer 16 and the organic semiconductor layer 15 can be improved.

Figure 2:
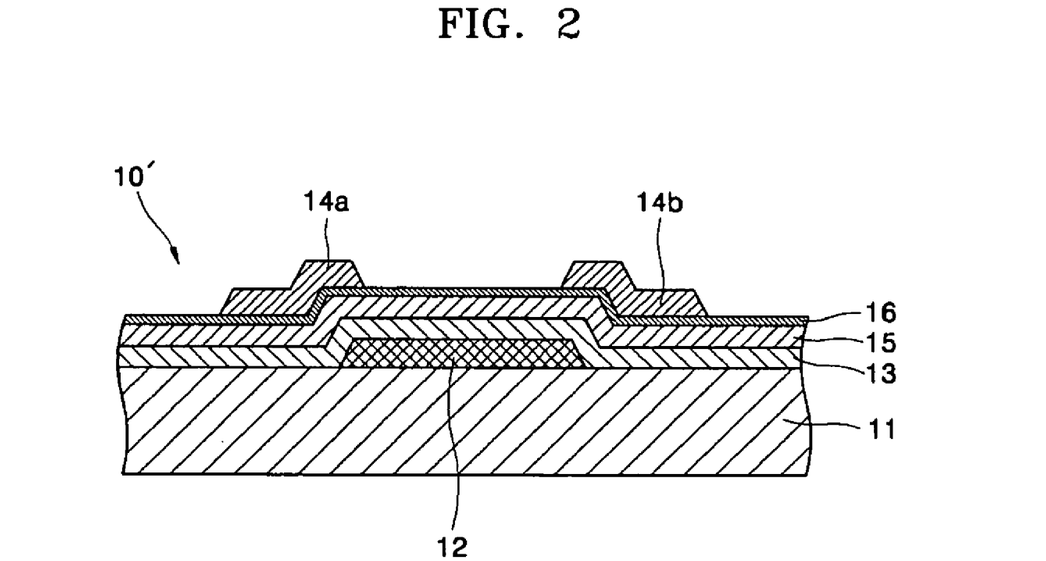

FIG. 2 is a sectional view of a TFT 10' according to another embodiment of the present invention. The TFT 10' includes a substrate 11, a gate electrode 12, an insulating layer 13, an organic semiconductor layer 15, an ohmic contact layer 16, and source and drain electrodes 14a and 14b, which are sequentially stacked upon one another.

For each of the layers forming the TFT 10' of FIG. 2, the detailed description above relating to the composition of the corresponding layers of the TFT 10 in FIG. 1 can be referred to. When the ohmic contact layer 16 of the TFT 10 is a self-assembled monolayer including a repeating unit or a compound of formula 1, 2, 3 or 4 above, * and *' indicate binding with a surface of the organic semiconductor layer 15.

Figure 3:
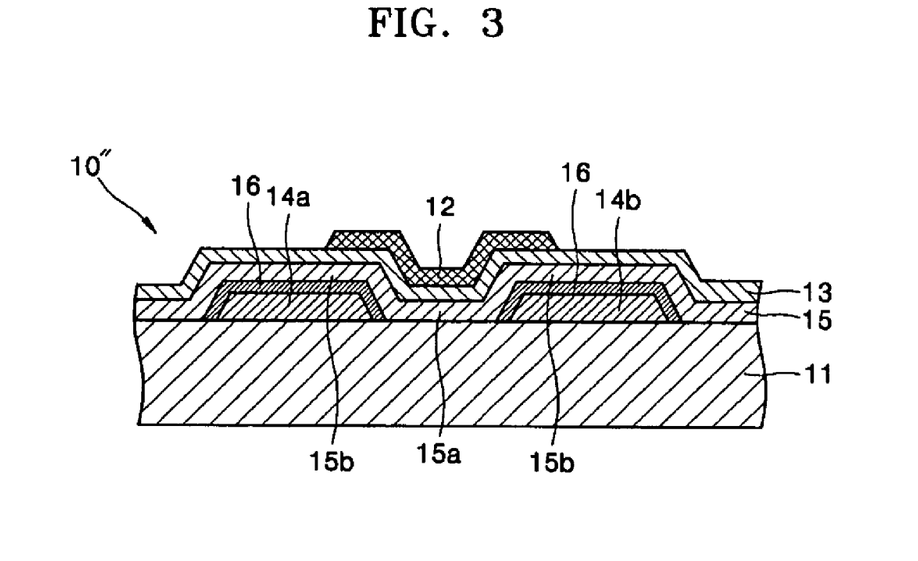

FIG. 3 is sectional view of a TFT 10" according to another embodiment of the present invention. The TFT 10" includes a substrate 11, source and drain electrodes 14a and 14b, an ohmic contact layer 16, an organic semiconductor layer 15, an insulating layer 13, and a gate electrode 12, which are sequentially stacked upon one another. For each of the layers forming the TCT 10" of FIG. 3, the detailed description of the composition of the corresponding layers of the TFT 10 in FIG. 1 can be referred to.

A TFT according to aspects of the present invention may be formed using various methods. A method of manufacturing a TFT according to an embodiment of the present invention may include: forming an insulating layer to cover a gate electrode formed on a substrate; forming source and drain electrodes in predetermined regions of the insulating layer corresponding to both ends of the gate electrode; forming an ohmic contact layer on the source and drain electrodes; and forming an organic semiconductor layer to cover the ohmic contact layer.

A method of manufacturing a TFT according to another embodiment of the present invention may include: forming an insulating layer to cover a gate electrode formed on a substrate; forming an organic semiconductor layer on the insulating layer; forming an ohmic contact layer on the organic semiconductor layer; and forming source and drain electrodes in predetermined regions of the ohmic contact layer corresponding to both ends of the gate electrode.

A method of manufacturing a TFT according to another embodiment of the present invention may include: forming source and drain electrodes on a substrate; forming an ohmic contact layer on the source and drain electrodes; forming an organic semiconductor layer on the ohmic contact layer; forming an insulating layer to cover the organic semiconductor layer; and forming a gate electrode in predetermined regions of the insulating layer corresponding to source and drain electrodes.

When the source and drain electrodes include an oxidizable metal, the forming of the source and drain electrodes may further include oxidizing the surfaces of the source and drain electrodes. This operation is performed in order to increase the adhesive force between the source/drain electrodes and the ohmic contact layer which will be formed later.

The oxidizing of the surfaces of the source and drain electrodes can be implemented using various methods. For example, a method of annealing the surfaces of the source and drain electrodes in an atmospheric condition, such as, for example, in an oxygen atmosphere, a method of treating the surfaces of the source and drain electrodes with a gas, such as, for example, oxygen plasma, a method of chemically treating the surfaces of the source and drain electrodes with an oxidant, such as, for example, hydrogen peroxide, or other methods can be used. The methods that can be used to oxidize the surfaces of the source and drain electrodes are not limited to these examples.

The forming of the ohmic contact layer may be carried out using a known deposition method; a known coating method, such as, for example, spin coating, deep coating, micro contact printing, inkjet printing, etc.; or a known self-assembled monolayer manufacturing method. In the self-assembled monolayer manufacturing method, a catalyst may be further used to facilitate a reaction, such as hydrolysis, condensation, etc., involved in forming the ohmic contact layer.

A TFT having the above-mentioned structure may be included in a flat panel display, such as a liquid crystal display (LCD), an organic light-emitting display, etc.

Figure 4:
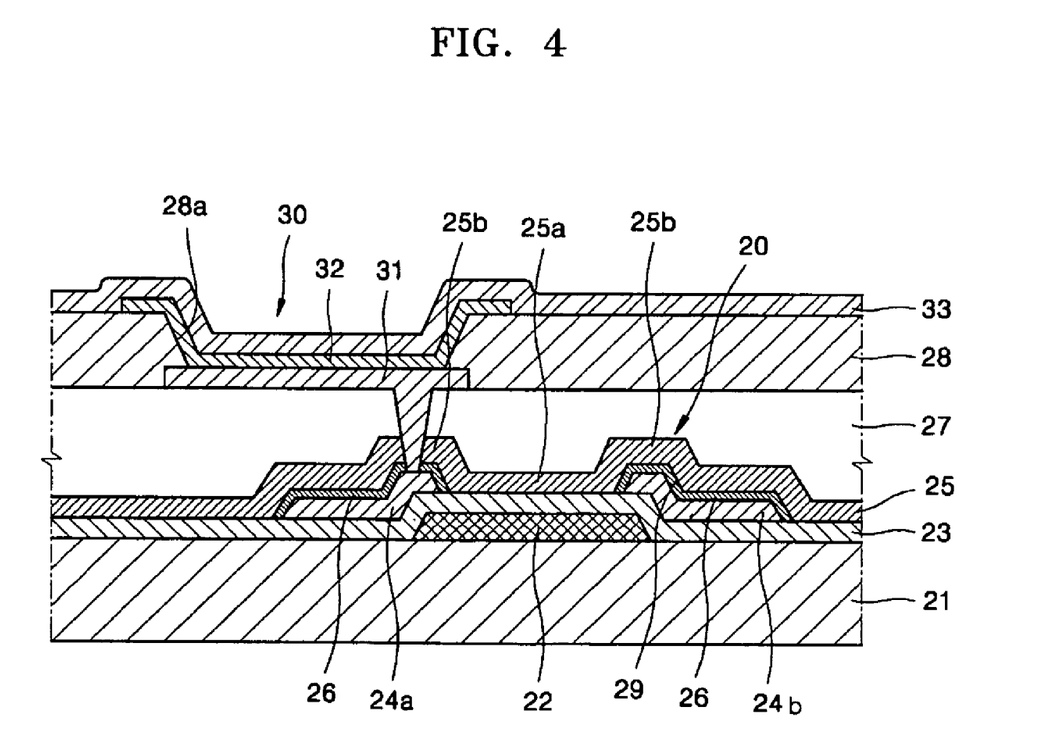
FIG. 4 is a sectional view of an organic light-emitting display including a TFT according to an embodiment of the present invention.

FIG. 4 is a sectional view of an organic light-emitting display according to an embodiment of the present invention as a flat panel display including a TFT described above. In particular, FIG. 4 illustrates a single sub-pixel of an organic light-emitting display. Each sub-pixel of an organic light-emitting display includes an organic light-emitting device (OLED) as a self-luminous element and at least one TFT.

The organic light-emitting display includes various pixel-patterns, such as, for example, red, green, and blue pixels, according to the luminescent color of the OLED.

Referring to FIG. 4, a gate electrode 22 having a predetermined pattern is formed on a substrate 21, and an insulating layer 23 is formed to cover the gate electrode 22. Source and drain electrodes 24a and 24b are formed on the insulating layer 23. An ohmic contact layer 26 is formed on the source and drain electrodes 24a and 24b. The detailed description of the ohmic contact layer 26 can be referred to above.

An organic semiconductor layer 25 is formed on the ohmic contact layer 26 to cover the ohmic contact layer 26. The organic semiconductor layer 25 includes source/drain regions and a channel region connected to the source/drain regions.

After forming the organic semiconductor layer 25, a passivation layer 27 is formed to cover the TFT 20. The passivation layer 27 is formed as a single-layered or multi-layered structure, and may be formed of an organic material, an inorganic material, or an organic/inorganic composite material.

A pixel defining layer 28, which defines a pixel, is formed on the passivation layer 27. An organic layer 32 of the OLED 30 is formed on a pixel electrode 31 and extends to a part of the pixel defining layer 28.

The OLED 30 displays predetermined image information by emitting light of a red, green or blue color according to the flow of a current. The OLED 30 includes the pixel electrode 31 connected to one of the source and drain electrodes 24a and 24b, a facing electrode 33 covering the entire pixel, and the organic layer 32 interposed between the pixel electrode 31 and the facing electrode 33. The present invention is not limited to this structure, and various structures of organic light-emitting displays can be applied.

The organic layer 32 may be a low-molecular weight organic layer or a polymer organic layer. When the organic layer 32 is a low-molecular weight organic layer, the organic layer 32 may have a structure including one or combinations of a hole injection layer (HIL), a hole transport layer (HTL), an emission layer (EML), an electron transport layer (ETL), and an electron injection layer (EIL). Examples of organic materials for the low-molecular weight organic layer include copper phthalocyanine (CuPc), N,N-di(naphthalene-1-yl)-N, N'-diphenyl-benzidine (NPB), tris-8-hydroxyquinoline aluminum (Alq3), etc. The small-molecular weight organic layer can be formed using, for example, vacuum deposition.

When the organic layer 32 is a polymer organic layer, the organic layer 32 may have a structure including an HTL and an EML. The HTL may be formed of poly-3,4-ethylendioxythiophene (PEDOT), and the EML may be formed of a poly-para-phenylenevinylene(PPV)-based or polyfluorene-based polymer material using screen printing, inkjet printing, etc.

The organic layer 32 is not limited to the above-described organic layers, and may have various structures.

The pixel electrode 31 may act as an anode, and the facing electrode 33 may act as a cathode. Alternatively, the polarities of the pixel electrode 31 and the facing electrode 33 may be reversed.

Unlike a method of forming an organic light-emitting display, a method of manufacturing an LCD further includes forming a lower substrate by forming a lower alignment layer (not shown) covering the pixel electrode 31.

A TFT according to aspects of the present invention can be installed in each sub-pixel as illustrated in FIG. 4, or in a driver circuit (not shown) where no image is formed.

In the organic light-emitting display, a flexible plastic substrate can be used as the substrate 21.

Hereinafter, aspects of the present invention will be described in greater detail with reference to the following example. The following example is for illustrative purposes only and is not intended to limit the scope of the invention.

EXAMPLE

A substrate including a gate electrode formed of MoW (100-nm thick), an insulating layer formed of $SiO_2$ (200-nm thick), and source and drain electrodes formed of ITO (100-nm thick) was prepared. The substrate was soaked in triethoxy-(triphenylamino) butyl-silane solution (50 mM anhydrous toluene) for three hours. The substrate was washed with toluene, acetone, and then isopropanol, and dried at 120° C. for an hour and cured. The substrate was coated with acetic acid as a dehydration condensation catalyst, and left at 50° C. for three hours. The substrate was washed with toluene and then methanol, and dried at 120° C. for an hour to form an ohmic contact layer including an SAM including a unit of formula (3). Next, an organic semiconductor layer was formed by depositing pentacene to a thickness of 70 nm to cover the source and drain electrodes and the ohmic electrode, thereby forming an organic TFT according to the present invention.

As described above, in a TFT according to aspects of the present invention, the ohmic contact between the source/drain electrodes and the organic semiconductor layer can be effectively achieved, and the adhesive force between the source/drain electrodes and the organic semiconductor layer is increased. Thus, a flat panel display with improved reliability can be realized using the TFT.

Although a few embodiments of the present invention have been shown and described, it would be appreciated by those skilled in the art that changes may be made in this embodi- ment without departing from the principles and spirit of the invention, the scope of which is defined in the claims and their equivalents.

What is claimed is:

1. A thin film transistor comprising:
   a gate electrode;
   source and drain electrodes insulated from the gate electrode;
   an organic semiconductor layer that is insulated from the gate electrode and is electrically connected to the source and drain electrodes;
   an insulating layer that insulates the gate electrode from the source and drain electrodes or the organic semiconductor layer; and
   an ohmic contact layer that is interposed between the source/drain electrodes and the organic semiconductor layer and that contains a hole transporting compound and/or is a self assembled monolayer (SAM) including a repeating unit of formula (1) below, or a moiety of formula (2) below:

formula (1)

formula (2)

where $X_1$ and $X_2$ are each a single bonded, a substituted or unsubstituted $C_1$-$C_{20}$ alkylene group, or -$Z_1$-NH—C(=O)—O-$Z_2$-, $Z_1$ and $Z_2$ are each a substituted or unsubstituted $C_1$-$C_{20}$ alkylene group;
$Y_1$ is a hole transporting unit;
$Y_2$, $W_1$ and $W_2$ are each hydrogen, a halogen atom, a $C_1$-$C_{20}$ alkyl group, a $C_1$-$C_{20}$ alkoxy group, or the hole transporting unit, at least one of $Y_2$, $W_1$ and $W_2$ is the hole transporting unit; and
* and *' indicate binding with the source and drain electrodes or the organic semiconductor layer, wherein the hole transporting compound is at least one selected from the group consisting of where $R_1$, $R_2$, $R_3$, $R_4$, $R_5$, $R_6$ and $R_7$ are each hydrogen, a substituted or unsubstituted $C_6$-$C_{30}$ aryl group, or a substituted or unsubstituted $C_5$-$C_{30}$ heteroaryl group, wherein at least one of $R_1$, $R_2$ and $R_3$, and at least one of $R_4$, $R_5$, $R_6$ and $R_7$ are a substituted or unsubstituted $C_6$-$C_{30}$ aryl group, or a substituted or unsubstituted $C_5$-$C_{30}$ heteroaryl group;
$R_8$ is hydrogen, or a substituted or unsubstituted $C_1$-$C_{30}$ alkyl group;
$Ar_1$ is a substituted or unsubstituted $C_6$-$C_{30}$ arylene group, or a substituted or unsubstituted $C_5$-$C_{30}$ heteroarylene group;
n is an integer from 1 to 10; and
$Q_1$, $Q_2$, $Q_3$, $Q_4$ and $Q_5$ are each selected from N, C, P and S.

2. The thin film transistor of claim 1, wherein the hole transporting compound and/or the compound having the hole transporting unit has a work function of 4.5-5.5 eV.

3. The thin film transistor of claim 1, wherein
the source and drain electrodes are made of a material that has a work function that is less than a work function of a material that makes up the organic semiconductor layer and
the hole transporting compound and/or the compound having the hole transporting unit has a work function of that is greater than the work function of the material of the source and drain electrodes and less than the work function of the material of the organic semiconductor.

4. The thin film transistor of claim 1, wherein the hole transporting compound includes at least one selected from the group consisting of N,N'-bis(3-methylphenyl)-N,N'-diphenyl-[1,1-biphenyl]-4,4'-diamine (TPD), N,N'-di(naphthalene-1-yl)-N,N'-diphenyl benzidine (NPD), 1,3,5-tricarbazolyl benzene, 4,4'-biscarbazolylbiphenyl (CBP), polyvinylcarbazole, m-biscarbazolylphenyl, 4,4'-biscarbazolyl-2,2'-dimethylbiphenyl, 4,'4"-tri(N -carbazolyl) triphenylamine, 1,3,5-tri(2-carbazolylphenyl)benzene, 1,3,5-tris(2-carbazolyl-5-methoxyphenyl)benzene, bis(4-carbazolylphenyl)silane, BMA-Nt, TBA, o-TTA, p-TTA, m-TTA, Spiro-TPD, and TPTE.

5. The thin film transistor of claim 1, wherein the hole transporting unit
includes a radical of at least one selected from the group consisting of where $R_1$, $R_2$, $R_3$, $R_4$, $R_5$, $R_6$ and $R_7$ are each hydrogen, a substituted or unsubstituted $C_6$-$C_{30}$ aryl group, or a substituted or unsubstituted $C_5$-$C_{30}$ heteroaryl group, at least one of $R_1$, $R_2$ and $R_3$, and at least one of $R_4$, $R_5$, $R_6$ and $R_7$ are a substituted or unsubstituted $C_6$-$C_{30}$ aryl group, or substituted or unsubstituted $C_5$-$C_{30}$ heteroaryl group;

$R_8$ is hydrogen, or a substituted or unsubstituted $C_1$-$C_{30}$ alkyl group;

$Ar_1$ is a substituted or unsubstituted $C_6$-$C_{30}$ arylene group, or a substituted or unsubstituted $C_5$-$C_{30}$ heteroarylene group;

n is an integer from 1 to 10; and $Q_1$, $Q_2$, $Q_3$, $Q_4$ and $Q_5$ are each selected from N, C, P and S.

6. The thin film transistor of claim 1, wherein the hole transporting unit includes at least one selected from the group consisting of a radical of N,N'-bis (3-methylphenyl)-N,N'-diphenyl-[1,1-biphenyl]-4,4'-diamine (TPD), N,N'-di(naphthalene-1-yl)-N,N'-diphenyl benzidine (NPD), 1,3,5-tricarbazolyl benzene, 4,4'-biscarbazolylbiphenyl (CBP), polyvinylcarbazole, m-biscarbazolylphenyl, 4,4'-biscarbazolyl-2,2'-dimethylbiphenyl, 4,'4"-tri(N -carbazolyl)triphenylamine, 1,3,5-tri(2-carbazolylphenyl)benzene, 1,3,5-tris (2-carbazolyl-5-methoxyphenyl) benzene, bis(4-carbazolylphenyl) silane, BMA-Nt, TBA, o-TTA, p-TTA, m-TTA, Spiro-TPD, and TPTE.

7. The thin film transistor of claim 1, wherein the ohmic contact layer is a self assembled monolayer (SAM) including a repeating unit of formula (3) below, or a moiety of formula (4) below:

where * and *' indicate binding with the source and drain electrodes or the organic semiconductor layer.

8. The thin film transistor of claim 1, wherein the ohmic contact layer is formed using a deposition method, a coating method, or a self-assembled monolayer manufacturing process.

9. The thin film transistor of claim 1, wherein the ohmic contact layer provides an adhesive force between the source and drain electrodes and the organic semiconductor layer.

10. The thin film transistor of claim 1, wherein the source and drain electrodes include at least one selected from the group of Au, Pd, Pt, Ni, Rh, Ru, Ir, Os, Al and Mo, an Al:Nd alloy, an MoW alloy, ITO, IZO, NiO, $Ag_2O$, $In_2O_3$—$Ag_2O$, $CuAlO_2$, $SrCu_2O_2$ and Zr-doped ZnO.

11. The thin film transistor of claim 1, wherein the organic semiconductor layer includes at least one of pentacene, tetracene, anthracene, naphthalene, α-6-thiophene, α-4-thiophene, perylene and a derivative thereof, rubrene and a derivative thereof, coronene and a derivative thereof, perylene tetracarboxylic diimide and a derivative thereof, perylene tetracarboxylic dianhydride and a derivative thereof, polythiophene and a derivative thereof, polyparaphenylenevinylene and a derivative thereof, polyparaphenylene and a derivative thereof, polyfluorene and a derivative thereof, polythiophenevinylene and a derivative thereof, polythiophene-heterocyclic aromatic copolymer and a derivative thereof, an oligonaphthalene and a derivative thereof, an oligothiophene of α-5-thiophene and a derivative thereof, metal-containing or metal-free phthalocyanine and a derivatives thereof, pyromellitic dianhydride and a derivative thereof, and pyromellitic diimide and a derivative thereof.

12. A flat panel display comprising the thin film transistor of claim 1 in each pixel, wherein the source or drain electrode of the thin film transistor is connected to a pixel electrode.

* * * * *